United States Patent [19]

Duffield

[11] Patent Number: 4,914,517

[45] Date of Patent: Apr. 3, 1990

[54] TUNER CONTROL APPARATUS HAVING TUNE-BY-LABEL CAPABILITY AND USING ALPHABETICAL LABEL STORAGE

[75] Inventor: David J. Duffield, Indianapolis, Ind.

[73] Assignee: Thomson Consumer Electronics, Inc., Indianapolis, Ind.

[21] Appl. No.: 334,067

[22] Filed: Apr. 6, 1989

[51] Int. Cl.⁴ ................... H04N 5/50; H04N 5/44; H04N 9/74

[52] U.S. Cl. ................... 358/191.1; 358/22; 358/194.1; 455/186; 455/603; 340/825.03

[58] Field of Search .............. 358/22, 191.1, 194.1; 340/825.03, 825.29; 455/151, 186, 603

[56] References Cited

U.S. PATENT DOCUMENTS

| | | | |
|---|---|---|---|
| 4,123,713 | 10/1978 | Wine | 325/455 |
| 4,187,469 | 2/1980 | Tanaka | 455/186 |
| 4,313,213 | 1/1982 | Farina et al. | 455/186 |
| 4,314,375 | 12/1982 | Belisomi | 455/186 |
| 4,356,509 | 10/1982 | Skerlos et al. | 358/194.1 |
| 4,456,925 | 6/1984 | Skerlos et al. | 358/194.1 |
| 4,644,349 | 2/1987 | Fujita et al. | 340/825.25 |
| 4,706,121 | 11/1987 | Young | 358/142 |

OTHER PUBLICATIONS

Service Manual for Grundig TV Receiver CUC 2400.
Hitachi VT-S625 User Manual, pp. 18-19.

*Primary Examiner*—John K. Peng
*Attorney, Agent, or Firm*—Joseph S. Tripoli; Peter M. Emanuel; Thomas F. Lenihan

[57] ABSTRACT

A tuning system is provided which allows a user to enter into a memory text labels associated with respective channels to be tuned so that, thereafter, a channel to be tuned may be selected by the user by entering its label. The time required to search the memory for a match with a previously stored label during a channel change operation is minimized by storing the labels in alphabetical order, and performing a binary search of the area in memory in which the labels are stored.

8 Claims, 7 Drawing Sheets

FIG. 5a

| | | | | 500 |
|---|---|---|---|---|
| 516 | | | | |
| 515 | | | | |
| 514 | | | | |
| 513 | W | T | H | R | 13 |
| 512 | W | N | B | C | 4 |
| 511 | W | C | B | S | 2 |
| 510 | E | S | P | N | 22 |
| 509 | | J | O | B | 9 |
| 508 | | I | P | O | 8 |
| 507 | | I | M | M | 7 |
| 506 | | I | N | D | 14 |
| 505 | | H | B | O | 6 |
| 504 | | C | N | N | 28 |
| 503 | | A | B | C | 5 |
| 502 | | | L | A | 10 |
| 501 | | | D | B | 7 |

| 520 | | K | Y | W | 3 |

FIG. 5b

| | | | | 500 |
|---|---|---|---|---|
| 516 | | | | |
| 515 | | | | |
| 514 | W | T | H | R | 13 |
| 513 | W | N | B | C | 4 |
| 512 | W | C | B | S | 2 |
| 511 | E | S | P | N | 22 |
| 510 | | K | Y | W | 3 |
| 509 | | J | O | B | 9 |
| 508 | | I | P | O | 8 |
| 507 | | I | M | M | 7 |
| 506 | | I | N | D | 14 |
| 505 | | H | B | O | 6 |
| 504 | | C | N | N | 28 |
| 503 | | A | B | C | 5 |
| 502 | | | L | A | 10 |
| 501 | | | D | B | 7 |

TUNER CONTROL APPARATUS HAVING TUNE-BY-LABEL CAPABILITY AND USING ALPHABETICAL LABEL STORAGE

FIELD OF THE INVENTION

This invention relates to the field of tuner controls for television receivers (including VCRs) and radios.

CROSS REFERENCE TO RELATED APPLICATIONS

This application is related to an application entitled TUNER CONTROL APPARATUS HAVING TUNE-BY-LABEL CAPABILITY filed in the names of David Jay Duffield and Billy Wesley Beyers, Jr., and assigned to the same assignee as the subject application.

BACKGROUND OF THE INVENTION

In the United States there are at least 3 major broadcasting networks (e.g. ABC, NBC, and CBS), and also a number of cable service networks (e.g. HBO, ESPN, Cinemax, etc.), each of which distributes broadcast television programs throughout the country. Many viewers tend to associate their favorite television programs with the networks that carry them. A common problem is that there are so many channels available that it is difficult for a viewer to remember which channel number corresponds to which network. For example, in some areas of the country a viewer has access to as many as 40 channels. Thus, tuning by channel number, although widely used, may not be desirable in these situations.

Furthermore, in the hotel/motel environment, the visitor is typically unfamiliar with local channel numbers. When the visitor wishes to watch a favorite program on a known major network, he may have difficulty locating the proper local channel owned by, or affiliated with the major network. Compounding this problem is the fact that it is common practice among cable companies in the United States to remodulate broadcast signals to different channels of the RF spectrum than those channels which they normally occupy. Unfortunately, this also has the effect of confusing the viewer because, for instance, UHF channel 29 may be remodulated (down converted) to occupy the frequency space of, for example, VHF channel 9. Thus, even if a viewer happened to know that the FOX Broadcasting Network corresponds to channel 29 (as it does in Philadelphia), the viewer may still have difficulty locating his desired programs when the signals transmitted by channel 29 are in fact received on cable channel 9.

A common solution to this problem is to distribute channel conversion charts to cable subscribers so that they may locate the proper cable channel, given the standard broadcast channel, from a printed television schedule. This solution is less than satisfactory because of the relatively large number of available channels.

Additionally, a problem arises because the channel numbers assigned to the major networks are not the same across the country. For example, the National Broadcasting Company (NBC) broadcasts on channel 4 in New York City, N.Y., on channel 3 in Philadelphia, Pa., on channel 5 in Cincinnatti, Ohio, and on channel 11 in Dayton, Ohio. Because television manufacturers cannot know in advance in which viewing areas their receivers will be operated, it is not possible to preprogram the tuning system at the factory to select a particular channel in response to the selection of a network's name.

Efforts have been made by manufacturers to relate channel numbers to network names. For example, it is known from GRUNDIG television receiver CUC-2400 to display on the television screen a station identification label (previously entered by the user) whenever a channel is selected. However, the user must still somehow remember which channel is assigned to which network, because channel selection in this system is by channel number.

Thus, it is desirable that television manufacturers provide remote control handunits which allow viewers to select the channels by name.

A tune-by-label system is known from U.S. Pat. No. 4,706,121 (Young). However, Young provides no means by which the user can enter labels of his own choosing, either for display or for selecting a channel. In Young, the labels are provided by a broadcaster, as part of a TV schedule transmitted to an in-home tuner controller. The labels, such as HBO and ESPN, are displayed in a menu for selection by the user. Such a system requires costly and complex circuitry. Perhaps, more importantly, it requires the cooperation of broadcasters to dedicate limited spectrum space to the transmission of schedule information.

Given the fact that a tune-by-label system is desirable, the memory requirements of such a system need be addressed. Specifically, the memory should be non-volatile so that it retains a user-entered label list, in the event of a power failure. However, a non-volatile memory, such as EEPROM (electrically erasable programmable read only memory), may require a relatively long "memory write" (storage) time (on the order of 40 ms per byte). It also requires a relatively long "memory read" time (on the order of 500 μS per byte). A search of a label list for a match is required during a tune-by-label channel change operation and entails a comparison of each character of the newly entered label and each character of the labels previously stored in memory until a match is found. In view of the memory read time requirements described above, such a search may undesirably add considerably to the total time necessary to effect the channel change.

SUMMARY OF THE INVENTION

According to the present invention, a tuning system is provided which allows a user to enter a text label and associate it with a particular channel to be tuned. Thereafter, a channel to be tuned may be selected by the user by entering its label. The tuning system controller stores the labels in a label memory area in alphabetical order so that label search time incident to channel changes is minimized in order that the total time for changing channels is not undesirably lengthened.

BRIEF DESCRIPTION OF THE DRAWING

FIGS. 5a and 5b illustrate a memory arrangement produced by implementation of the flowchart of FIG. 4.

DETAILED DESCRIPTION OF THE DRAWING

Figure 1:
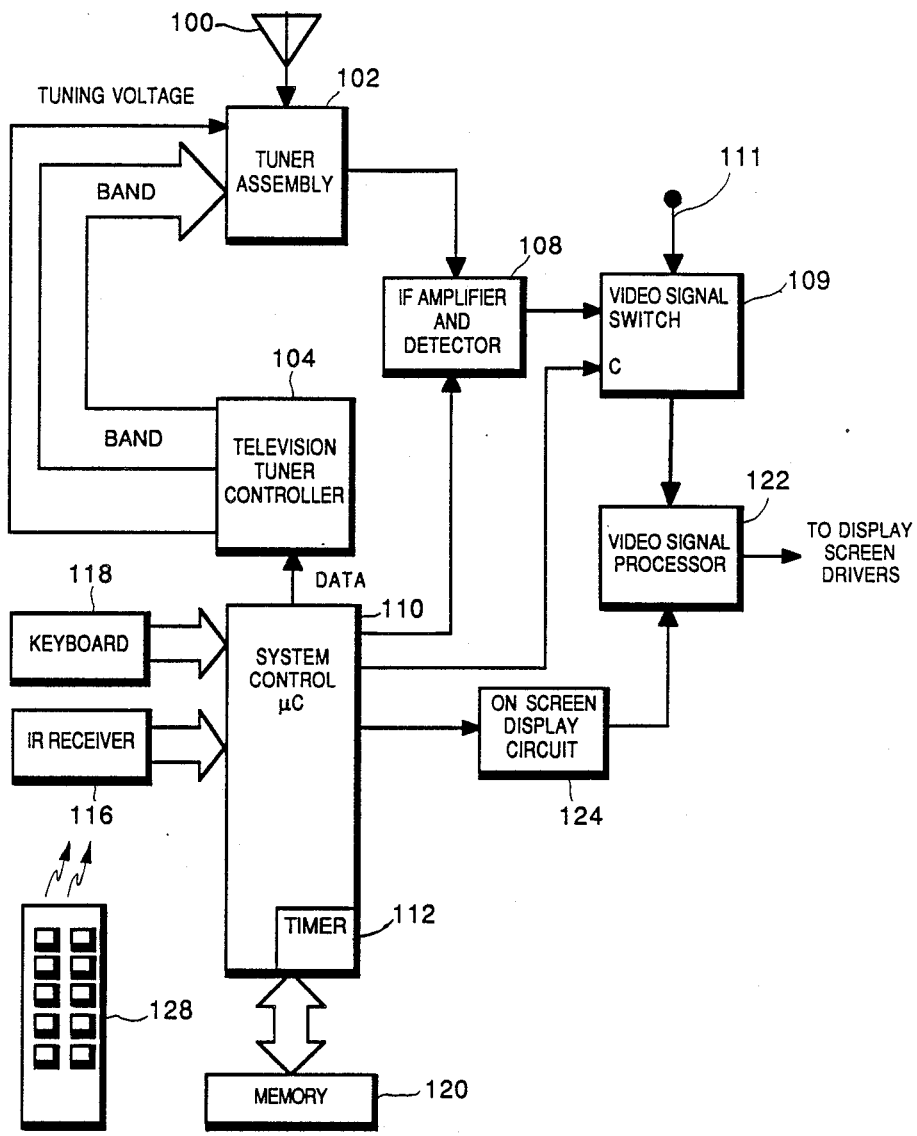
FIG. 1 is a block diagram of the tuning portion of a television receiver suitable for implementing the invention.

Referring to FIG. 1, a television receiver includes an antenna 100 which receives radio frequency (RF) signals and applies them to a tuner assembly 102. Tuner assembly 102 selects and amplifies a particular RF signal under control of a tuner controller 104 which provides bandswitching signals and tuning voltage signals to tuner assembly 102.

Tuner assembly 102 converts the received RF signal to an intermediate frequency (IF) signal and provides an IF output signal to IF amplifier and detector 108. IF amplifier and detector 108 amplifies the IF signal applied to its input terminal and detects the video information contained therein. This detected video information is applied as one input to a video signal switch 109, the other input of which is coupled to a baseband video input terminal 111 to which an external source of video, such as a VCR may be connected. Video signal switch 109 has a control input C for receiving a switching control signal. The output terminal of video switch 109 is coupled to one input of a video signal processor unit 122, the other input of which is connected to an on-screen display circuit 124. IF amplifier and detector 108 also detects an audio signal for processing in an audio channel (not shown).

Tuner controller 104 generates the before-mentioned tuning voltage signals and bandswitching signals in response to control signals applied from a system control microcomputer (μC) 110. Microcomputer 110 also generates the switching control signal for video signal switch 109. The terms "microcomputer" and "microprocessor" as used herein are equivalent. Microcomputer 110 receives user-initiated commands from an infrared (IR) receiver 116 and from a keyboard 118 mounted on the television receiver itself. Microcomputer 110 includes program memory (ROM) (not shown) and stores channel-related data in a random access memory (RAM) 120. RAM 120 may be of either the volatile or non-volatile type, and the term "RAM" is intended to include EEPROM. One skilled in the art will recognize that if volatile memory is utilized that it may be desirable to use a suitable form of standby power to preserve its contents when the receiver is turned off. The television receiver described thus far is known, for example, from the RCA CTC-140 color television receiver chassis manufactured by Thomson Consumer Electronics, Inc., Indianapolis, Ind. The subject invention will now be described in detail.

Figure 2:
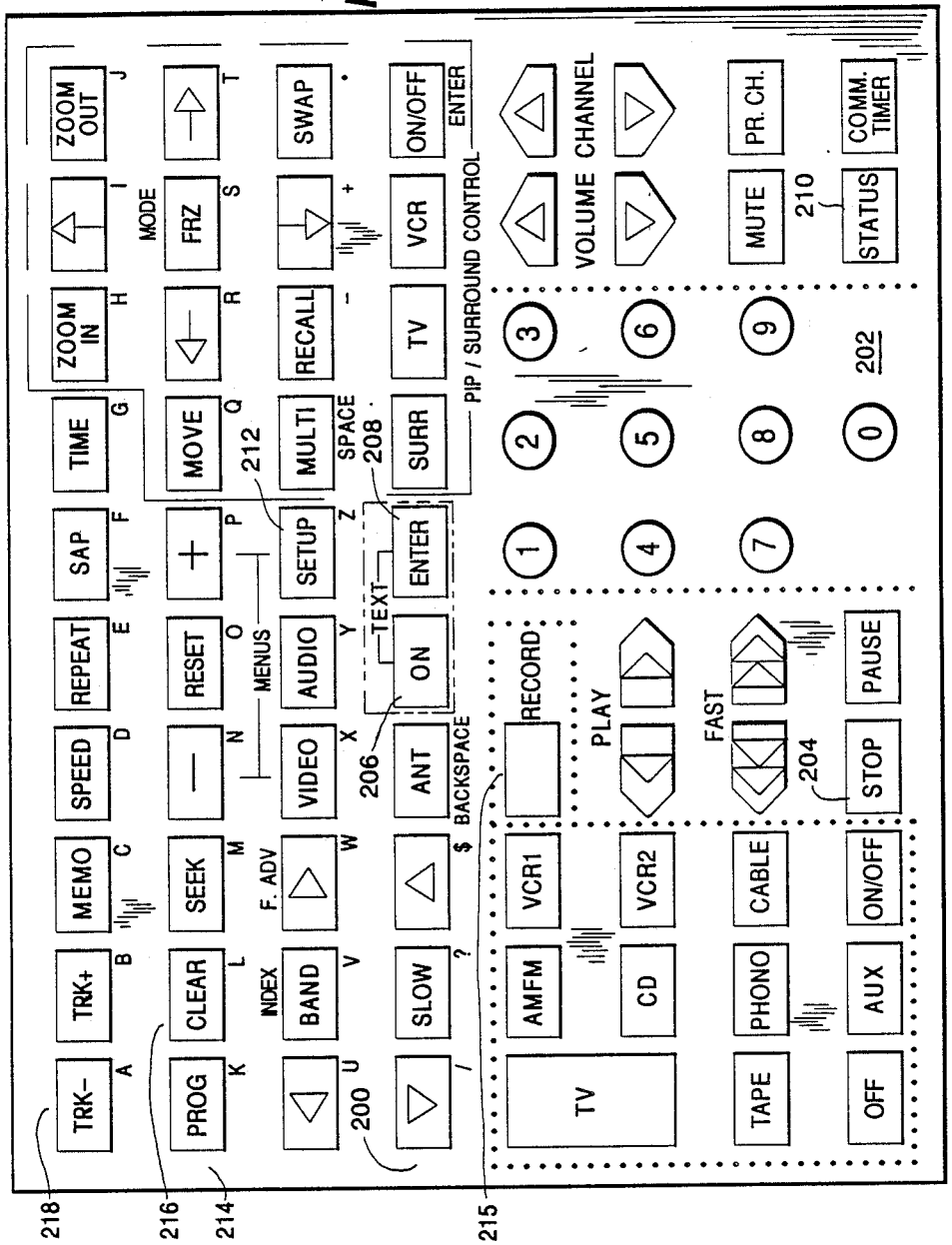
FIG. 2 is an illustration of the keyboard of a remote control handunit suitable for implementing the invention.

IR receiver 116 receives IR signals transmitted by, for example, a remote control handunit 128 having a keyboard such as the one shown in FIG. 2 designated 200. Keyboard 200 may include keys 202 for entering the digits 0-9, keys 203 for entering channel up and channel down commands and a key 204 for turning the receiver on and off. Remote control keyboard 200 may also include a section labelled TEXT having a key 206 (labelled ON) and a key 208 (labelled ENTER), the operation of which will be described below. Each of the keys in the top three rows, and five keys of the fourth row have a subscript indicating a second function for its respective key. Pressing TEXT ON key 206 enables these keys to be used for entering characters of the alphabet, punctuation marks, a space character, and a backspace command. The first function of each of these keys (TRK−, TRK+, etc.) which is not directly relevant to the subject invention, will not be discussed. Remote control handunit 128 includes therein electronic circuitry (not shown) for encoding a signal to be transmitted in accordance with the particular keys pressed.

Figure 3A:
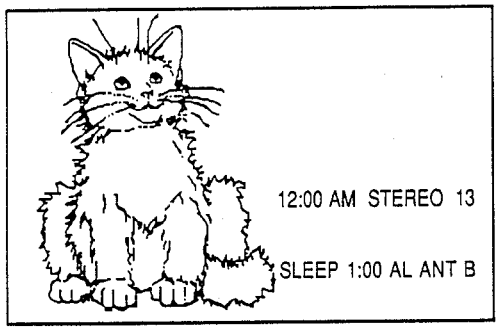
FIGS. 3a-3d are illustrations of display screens generated by the circuitry of FIG. 1.
Figure 3B:
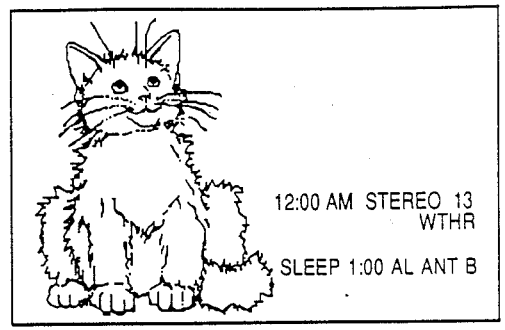

Operation of the apparatus illustrated in FIGS. 1, and 2, and the display screens illustrated in FIGS. 3a-3e will now be described with reference to FIG. 4. The subject invention makes use of the on-screen display capabilities already present in, for example, the RCA CTC-140 television receiver referred to above. FIG. 3a illustrates a STATUS display screen which is displayed by the CTC-140 television receiver in response to IR signal transmitted when a user presses a STATUS key, such as STATUS key 210 of remote control keyboard 200. The STATUS display provides information as to time-of-day, station tuned, whether or not a "sleep feature" has been enabled, and which of two antenna connectors (ANT B) have been selected for coupling RF signals to the tuner. FIG. 3b illustrates a STATUS display screen modified in accordance with the present invention to display a label (in this case the station call letters WTHN) immediately below the channel number. The label (WTHN) associated with the channel number (13) is entered ("keyed-in") by a user as will be described below. Of course, the label does not have to represent the station call letters but rather could be any alphanumeric label comprising any of one to four characters representing letters, numbers, or punctuation marks. Thus, a user can enter any convenient label which would aid him or her in selecting a desired channel.

Figure 3C:
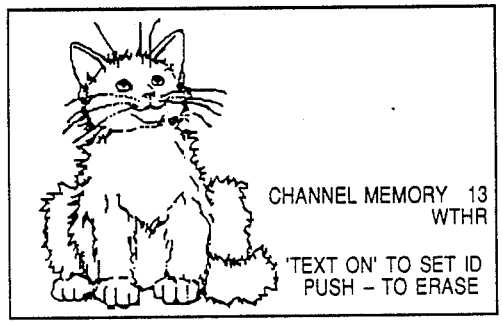

The CHANNEL MEMORY display of FIG. 3c is used for entering channel numbers and associated labels into memory. The CHANNEL MEMORY SCREEN (FIG. 3c) is displayed in response to the activation of MENU SETUP key 212 of remote control unit keyboard 200. In the illustration of FIG. 3c channel 13 has already had a label WTHR stored for display. The legend 'TEXT ON' TO SET ID at the bottom of the display is an instruction to the user that, if he desires, he may press TEXT ON key 206 of remote control unit keyboard 200 to enter a text entry mode for adding a label to the CHANNEL MEMORY display for a particular channel, or for changing a label previously entered. Pressing TEXT ON key 206 causes the generation of the display of FIG. 3d.

Figure 3D:
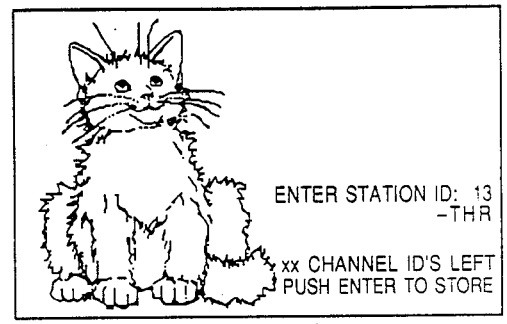

The dash (−) in the first character position of the label in FIG. 3d is a prompt character which serves as a cursor to indicate the label position that will be filled by the next character to be entered. The display of the dash may also alternate with a character from a previously entered label (in this case W) to draw even more attention to the character position to be filled. The legend "xx CHANNEL ID'S LEFT" of FIG. 3d, where xx is actually a number, indicates to the user the amount of space remaining in label memory.

Figure 4:
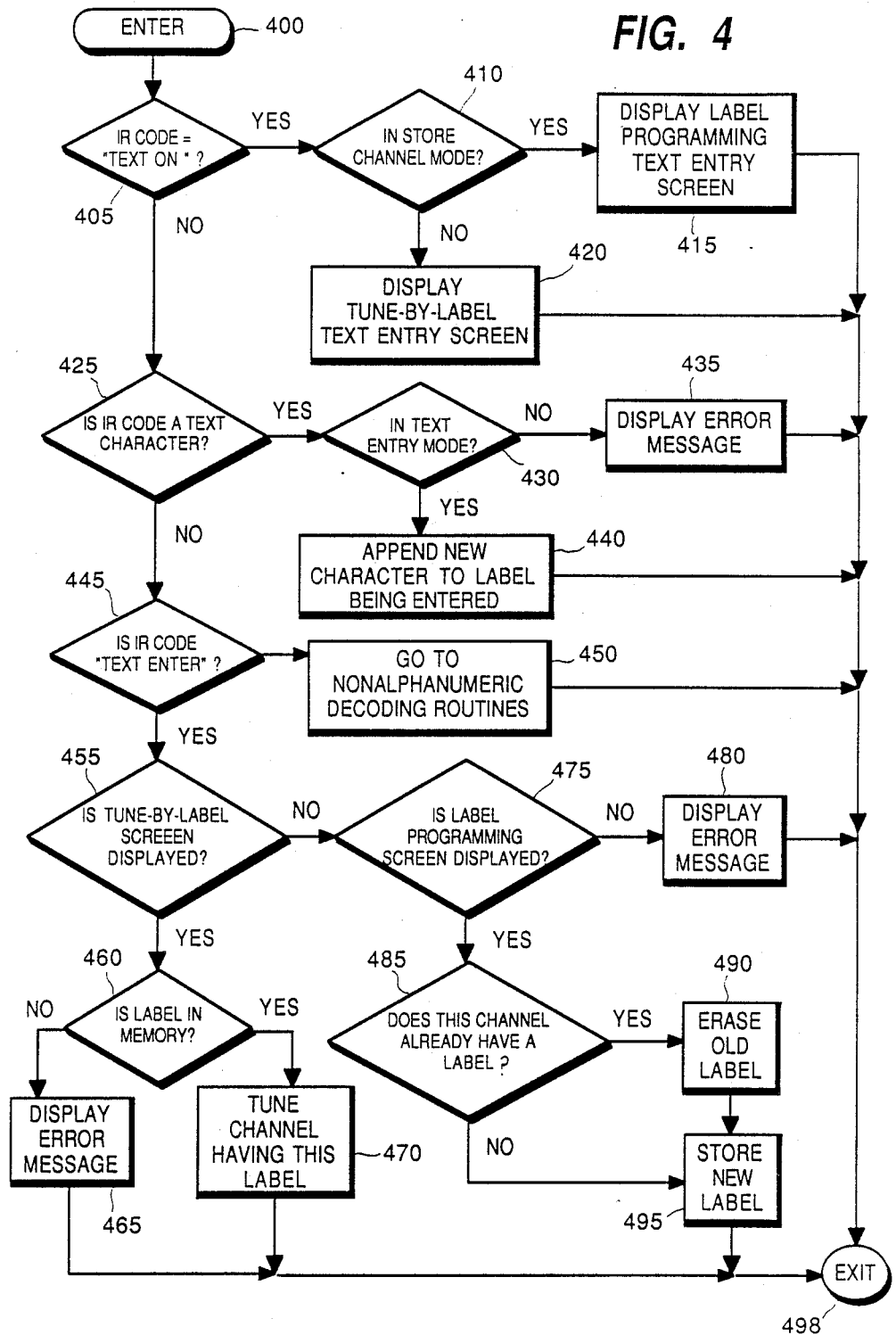
FIG. 4 is a flowchart of a program for use with the circuitry of FIG. 1, for implementing the invention.

The relevant portion of the keycode decoding routine for microcomputer 110 is illustrated in FIG. 4, and is entered at step 400 from other portions of the keycode decoding routine. The received keycode is examined to see if it is the TEXT ON code sent in response to the pressing of key 206 of remote control keyboard 200 (step 405). If so, a check is made (step 410) as to whether channel information is currently being stored in memory 120 (i.e. is a CHANNEL MEMORY screen being displayed?). If channel numbers are currently being stored, the program causes the display of a label programming text entry screen (step 415) as illustrated in FIG. 3d.

Figure 3E:
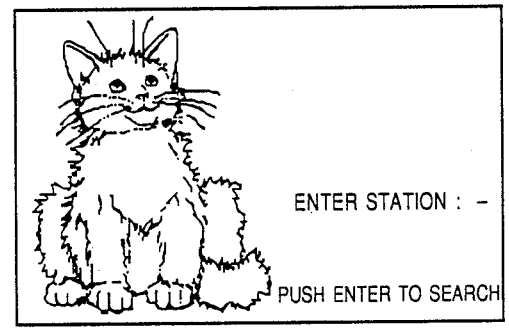

If, however, a label is not in the process of being stored, it is assumed that the text is being entered for the purpose of tuning a new channel, and a tune-by-label text entry screen is displayed (step 420) on the display screen as illustrated in FIG. 3e, and the routine exited.

The next keycode received should be a text character which therefore will cause the program to take the NO path from decision diamond 405 to decision diamond 425 wherein a check is made to see if the received keycode is a text character. If the keycode does correspond to a text character, a decision is made as to whether the program is in a text entry mode (step 430). If not, an error message is displayed on the display screen (step 435) and the program is exited normally. If the program is in a text entry mode (step 430), the new character is appended to the current label being keyed in (step 440) (or becomes the first character of a new label).

If, on the other hand, the received keycode did not correspond to a text character (step 425), then the NO path will be followed to decision diamond 445. In decision diamond 445, it is determined if the keycode corresponds to the TEXT ENTER key 208. If not, the current routine is exited by way of the decoding routines for non-alphabetical keycodes (step 450). If the TEXT ENTER key is decoded (step 445), then a check is made to see if the TUNE-BY-LABEL screen is displayed (step 455). If so, the program recognizes that the user has finished entering the label, and it begins a search to see if that label exists in memory 120 (step 460). If the label does not exist in memory 120, a "LABEL NOT FOUND" error message is displayed (step 465). If the label is found in step 460, then the channel corresponding to this label is tuned (step 470).

Returning to step 455, if the TUNE-BY-LABEL screen (FIG. 3d) is not currently being displayed, then a check is made (step 475) to see if the LABEL PROGRAMMING screen is displayed (FIG. 3c). If not, then a suitable error message is displayed (step 480). If, however, the LABEL PROGRAMMING screen is displayed (step 475), then a check is made to see if the current channel being labelled already has a label associated with it (step 485). If so, the old label is erased (step 490), the new label stored (step 495), and the routine is exited (step 498). If the channel had no label (step 485), then the program advances directly to step 495 for storing the new label.

In a tune-by-label tuning system such as the one described above, a search of memory for a match with a particular label is an additional step, not required in a "tune by channel number" system, which will increase the overall tuning time when changing channels. That is, in order to ensure that a keyed-in label matches a stored label, a four character comparison between the two must be made. Thereafter, the label must be converted to data either representing the channel number, the oscillator frequency or the magnitude of the tuning voltage. It is recognized herein that the user-entered label data may be stored randomly, for example, in the sequence in which it is entered, or ordered and stored in some logical sequence. If the data were to be stored randomly in the label memory are, and if the searches were to begin at the start of the label memory area and progress from label-to-label, then the duration of the search will undesirably vary with the position of a particular label in the memory. That is, if the label searched for is found in the first location examined, then the search is terminated in the shortest possible time. On the other hand, if the label searched for is found in the last of the label storage locations, then the search will be terminated in the longest possible time.

Viewers have become accustomed to tuning systems which operate relatively quickly with little, or no discernible difference in speed of tuning between different channel numbers. Therefore, it is desirable to minimize the time required to locate a label in memory, so that the overall tuning time is not unnecessarily increased. This becomes more important as the number of stored labels increases.

It is herein recognized that the programming of labels associated with desired channels occurs relatively infrequently, while a search incident to a channel change occurs with much greater frequency. In view of the above, it is herein recognized that it is acceptable to decrease speed of programming in order to increase label search speed during a channel change.

Accordingly, as shown in FIGS. 5a and 5b, the program portion for the entry of labels produces a memory arrangement wherein labels are arranged alphabetically, and wherein each label is right-justified to facilitate retrieval searches for channel selection. It is noted that a three character label, for example, ABC may be entered by a user as "_ABC" or "ABC₁₃". Both of the above labels will be right-justified and stored as "_ABC". This prevents user confusion as to the location of the space character, and additionally serves to physically locate the displayed label more toward the right-hand area of the display screen, so as to lessen interference with the picture being displayed. The labels may be from one to four characters in length. Four character labels are stored in higher memory (i.e. farther from the start of memory) than are three character labels, and so on. Referring to FIG. 5a, thirteen labels and their associated channel numbers are stored in alphabetical order in a memory 500 in locations 501–513 respectively. A three character label recently entered, is shown stored in a "holding" memory location 520 in preparation for storage. In FIG. 5b newly-entered label KYW has been properly stored in memory location 510. Note that the leading space is also an ASCII text character (20 Hexadecimal (HEX), or 32 decimal), and so exhibits a value which can be used for comparison. Therefore, while a viewer may consider KYW to be a three character label, in fact, the program treats it as a four character label, by evaluating and comparing the ASCII value of the leading space.

The search is performed much more quickly when the labels are stored in alphabetical order than when randomly stored, because once the labels have been arranged in an order, a binary search can be performed. The term "binary search" as used herein means a search in which the label memory area is divided into two parts, one part being rejected on the basis of a comparison with the label being searched. This process is repeated on the accepted part of label memory until the desired label is found. A binary search will be explained by example with respect to FIGS. 5d and 5b, below.

Figure 6:
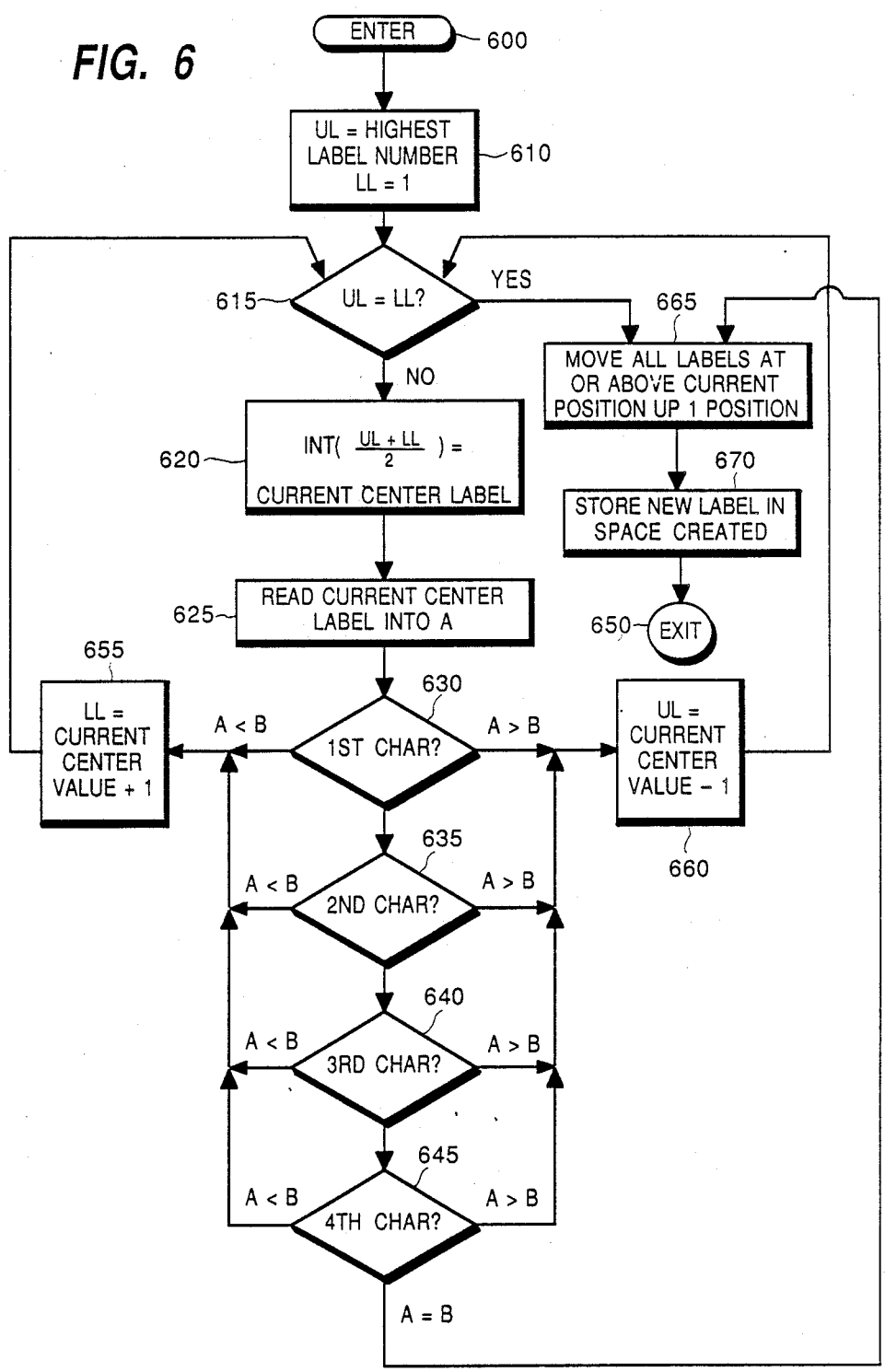
FIG. 6 illustrates in detail a portion of the flowchart of FIG. 4.

As noted above, the short search duration described above comes at the expense of a longer time being required for storage. Referring again to FIGS. 5a and 5b, and to the flowchart of FIG. 6, note that each of the labels stored in locations 510–513 of FIG. 5a has been read and rewritten to locations 511–514, respectively, in order to create room to store the new label in location 510. The flowchart of FIG. 6 illustrates in detail program block 495 (STORE NEW LABEL) of the flowchart of FIG. 4. This portion of the program is entered at step 600. Comparison location B holds the received keycode and corresponds to holding location 520 of FIG. 5a. Microcomputer 110 keeps a record of the number of labels entered by a user. In step 610, the maximum necessary range of LABEL memory to be searched is defined by storing the number of labels entered (i.e. the highest location that need be examined) in a memory location designated UL (upper limit), and storing the number 1 (i.e. the lowest label memory location) in a memory location designated LL (lower limit). If UL is not equal to LL (step 615), then the search has not yet converged, and the NO path is taken to step 620, wherein the current center position of label memory 500 is determined by taking the integer portion of the average of the upper and lower limits (i.e. the integer portion of (UL+LL)/2). The current center label in memory is read into a location A (step 625), the contents of which will be compared to the contents of holding location B on a character-by-character basis in steps 630–645. In each of steps 630–645, if the label in memory has a lower ASCII value than the newly entered label, the A<B path is taken to step 655. In step 655, the current center value+1 is stored in the lower limit memory location (LL). This has the effect of dividing the label memory area in half by discarding all locations at or below the current center value. The program then loops back to step 615 to see if it has converged, and if not, computes a new center value in step 620. If in step 630–645 a determination is made that the user-entered value is less than the center value in memory, then the center value-1 is stored in the upper limit memory location (UL) (step 660). This has the effect of dividing the remaining memory in half by discarding all locations at or above the current center value. The program continues in this manner until it finds the label, or until it converges to a condition where UL=LL at which point all labels at or above the last upper limit location (i.e. the current value in UL) are moved up (farther from the start) one label location (step 665). This creates space in the proper location in memory to insert the new label (step 670), such that the contents of the label memory will be in ascending alphabetical order. Note that even if the newly entered label were found to exactly match a label already stored in memory (i.e. the A=B path were followed in all of steps 630–645), the program advances to step 665, creates space in label memory and stores it (although the duplicate label will have a different channel number associated with it). The first of the duplicate labels which is encountered during a binary search will be the one which is tuned. This feature was provided because in some areas of the country viewers can receive the same programming via the same network on two different channels. Thus, the user can assign the same label to each channel.

The label insertion shown in FIGS. 5a and 5b required twenty read operations of memory 500 and twenty write operations to memory 500 (i.e. one read operation and one store operation per character and channel number) to clear a label memory location, plus five store operations to store the new label and channel number (i.e. the space character must also be stored in memory). It is recognized that when there are many labels to be stored, and when non-volatile memory such as EEPROM (electrically erasable programmable read only memory) is used (which typically has long memory-write times), the storage time may be several seconds. As noted above, however, the label storage process is relatively seldom exercised compared to the number times the retrieval process is exercised, and therefore the delay in storing a label is an acceptable compromise to ensure fast search time during tuning.

Figure 7:
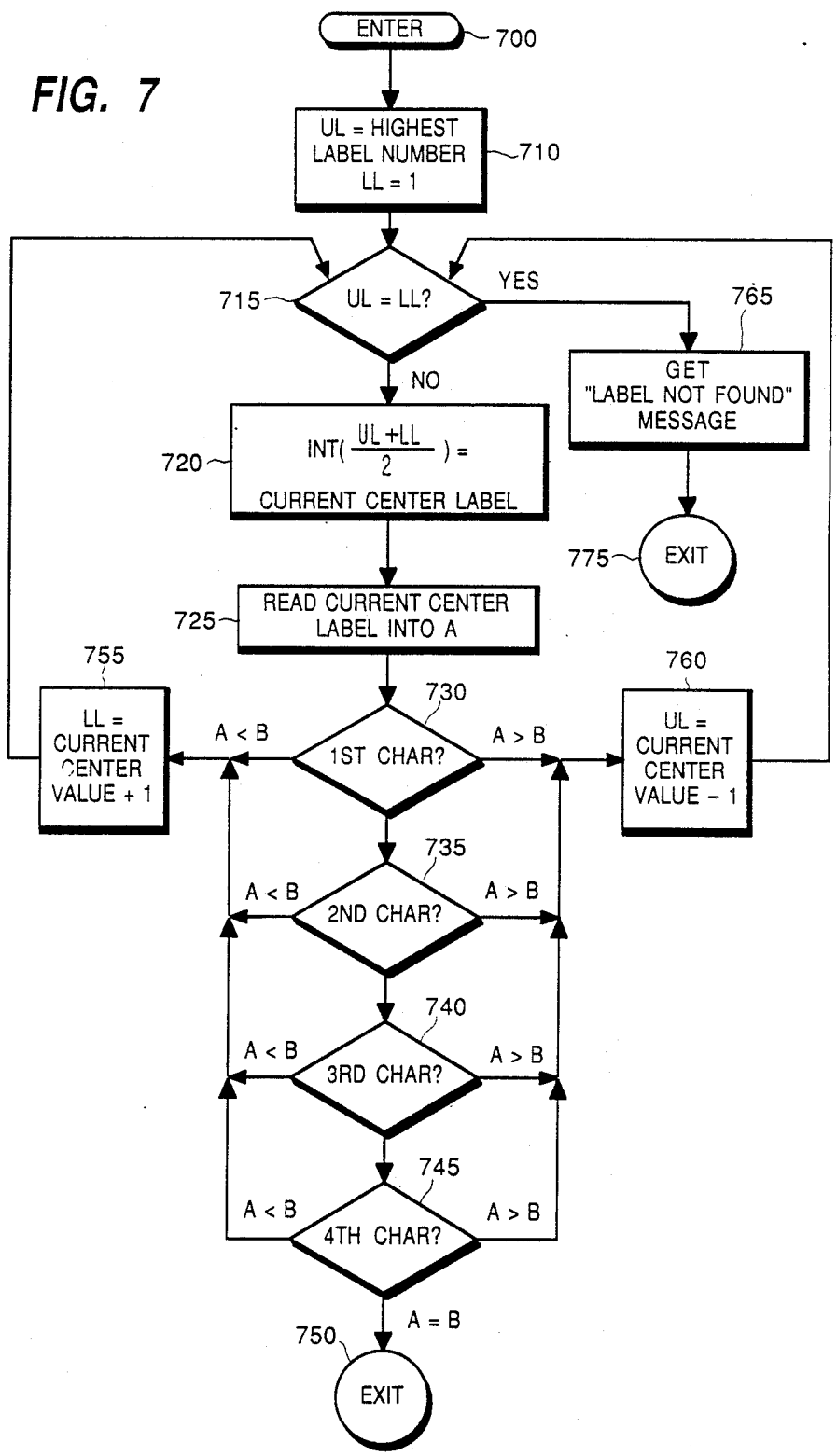
FIG. 7 illustrates in detail another portion of the flowchart of FIG. 4.

FIG. 7 illustrates in detail the contents of decision diamond 460 of FIG. 4. This portion of the control program is the search algorithm used during the tune-by-label process. Steps 700–760 perform in the same manner as similarly numbered steps in FIG. 6, and this function will not be described again. There are only two exits from this routine, 750 which corresponds to the YES path of decision diamond 460 (i.e. a matching label is found in memory), and 775 which corresponds to the NO path from decision diamond 460 (label not found). As noted above, if the label is found, the tuning data associated therewith is read from memory and used in tuning the desired channel.

Although in the illustrated embodiment, it is assumed that text characters are encoded as ASCII (American Standard Code for Information Interchange) characters, one skilled in the art will recognize that there are other codes which will also perform satisfactorily.

It is further noted that modern television monitor/receivers include baseband video and audio connectors for connecting signals from, for example, a VCR. Terminal 111 of FIG. 1 is such a video connector. The audio connector is not shown. It is considered within the scope of this invention to allow selection by label for these external connectors. For example, a pair of video in and audio in connectors may be assigned the label VCR1, TAPE, or any other label which is convenient for the user. Upon receiving the baseband selection label, controller 110 would cause the selection of the baseband signals in the manner known, for example, from the CTC-140 television receiver mentioned above.

What is claimed:

1. A tuning system comprising:
   an input terminal for receiving a plurality of RF signals;
   tuning means coupled to said input terminal for selecting a particular RF signal from said plurality of RF signals in response to a tuner control signal;
   memory means for storing label data representative of labels comprising at least one alphabetical character and tuning data associated with respective channels for tuning said channels;
   data entry means for generating said label data and said tuning data under user control;
   control means coupled to said data entry means for evaluating said label data and for storing said label data in said memory means in alphabetical order and storing said tuning data in said memory means during a programming mode; and
   said control means retrieving said tuning data corresponding to a particular channel to be tuned from said memory means in response to label data corresponding to said particular channel.

2. The tuning system of claim 1 wherein said control means is a microcomputer, and said control means stores the number of programmed label locations.

3. The tuning system of claim 2 wherein said control means retrieves said tuning data from said memory means by performing a binary search on the contents of said memory means in response to the entering of said label data by a user.

4. The tuning system of claim 2 further comprising on-screen display means for generating signals suitable for displaying said labels.

5. The tuning system of claim 4 wherein said label is displayed on said display screen along with the channel number of said particular channel with which said label is associated.

6. A signal selection system comprising:
an RF input terminal for receiving a plurality of RF signals;
tuning means coupled to said input terminal for selecting a particular RF signal from said plurality of RF signals in response to a tuner control signal;
a baseband input terminal for receiving a baseband signal;
memory means for storing, in alphabetical order, label data representative of labels comprising at least one alphabetical character, and tuning data associated with respective channels for tuning said channels, wherein one of said labels is associated with said baseband input terminal for selecting said baseband signals;
data entry means for generating said label data and said tuning data under user control;
control means coupled to said data entry means for evaluating said label data and for storing said label data in alphabetical order and for storing said tuning data in said memory during a programming mode, and for retrieving said data from said memory means for selecting one of said signals in response to label data input by a user.

7. A signal selection system comprising:
selection means having first and second input terminals for receiving first and second signals, said selection means selecting a particular signal from said first and second signals in response to a selection control signal;
memory means for storing, in alphabetical order, label data representative of labels comprising at least one alphabetical character, wherein one of said labels is associated with one of said input terminals for selecting said particular signal;
data entry means for generating said label data under user control;
control means coupled to said data entry means for evaluating said label data and for storing said label data in alphabetical order in said memory during a programming mode, and for retrieving said data from said memory means for selecting one of said signals in response to label data input by a user.

8. The system of claim 7 wherein said selection means is a video switch and said signals are baseband video signals.

* * * * *